United States Patent
Song et al.

(10) Patent No.: US 12,048,181 B2
(45) Date of Patent: Jul. 23, 2024

(54) DISPLAY DEVICE INCLUDING FOLDABLE DISPLAY PANEL

(71) Applicant: Samsung Display Co., Ltd., Yongin-Si (KR)

(72) Inventors: Kicheol Song, Suwon-si (KR); Youngmoon Kim, Asan-si (KR); Nari Ahn, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 167 days.

(21) Appl. No.: 17/475,893

(22) Filed: Sep. 15, 2021

(65) Prior Publication Data
US 2022/0238837 A1    Jul. 28, 2022

(30) Foreign Application Priority Data
Jan. 22, 2021    (KR) .......................... 10-2021-0009403

(51) Int. Cl.
| | | |
|---|---|---|
| H10K 50/84 | (2023.01) | |
| G09F 9/30 | (2006.01) | |
| H10K 50/80 | (2023.01) | |
| H10K 50/842 | (2023.01) | |
| H10K 50/844 | (2023.01) | |

(Continued)

(52) U.S. Cl.
CPC ....... *H10K 50/8426* (2023.02); *H10K 50/844* (2023.02); *H10K 50/868* (2023.02); *G02F 1/133305* (2013.01); *G02F 1/133331* (2021.01); *G06F 1/1641* (2013.01); *G06F 1/1652* (2013.01); *G09F 9/301* (2013.01); *H10K 77/111* (2023.02); *H10K 2102/311* (2023.02)

(58) Field of Classification Search
CPC ............. H10K 50/8426; H10K 50/544; H10K 50/868; H10K 77/111; H10K 2102/311; G02F 1/133331; G02F 1/133305; G06F 1/1641; G06F 1/1652; G09F 9/301
See application file for complete search history.

(56) References Cited

U.S. PATENT DOCUMENTS

| 6,878,441 B2 | 4/2005 | Kondo et al. |
| 10,240,068 B2 | 3/2019 | Nam et al. |

(Continued)

FOREIGN PATENT DOCUMENTS

| EP | 3751390 A1 * | 12/2020 | ............... G01N 1/28 |
| KR | 1020000035577 B1 | 6/2000 | |

(Continued)

*Primary Examiner* — Ida M Soward
(74) *Attorney, Agent, or Firm* — CANTOR COLBURN LLP

(57) ABSTRACT

A display device includes a display panel that may be folded with reference to at least one folding axis, a polarization layer disposed on the display panel, an adhesive layer disposed on the polarization layer, and a window disposed on the adhesive layer, and having one surface facing the adhesive layer. A 180 degree (°) peel adhesion of the adhesive layer to the one surface of the window may be about 493 gram-force per inch (gf/inch) to about 817 gf/inch under the conditions of a temperature of about 60 degrees Celsius (° C.) and a relative humidity of about 93 percent (%). Accordingly, the display device including the adhesive layer may exhibit good durability, and maintain the reliability thereof.

20 Claims, 6 Drawing Sheets

(51) Int. Cl.
  *H10K 50/86*    (2023.01)
  *G02F 1/1333*   (2006.01)
  *G06F 1/16*     (2006.01)
  *H10K 77/10*    (2023.01)
  *H10K 102/00*   (2023.01)

(56) References Cited

U.S. PATENT DOCUMENTS

| | | | |
|---|---|---|---|
| 10,792,902 B2 | 10/2020 | Kanno et al. | |
| 2016/0122600 A1* | 5/2016 | Moon | C09J 7/22 |
| | | | 428/354 |
| 2017/0200915 A1* | 7/2017 | Lee | H10K 59/40 |
| 2017/0247579 A1* | 8/2017 | Kwak | B32B 27/36 |
| 2017/0309867 A1* | 10/2017 | Mun | H10K 50/86 |
| 2018/0354227 A1* | 12/2018 | Park | B32B 27/40 |
| 2019/0006620 A1* | 1/2019 | Kim | G02B 5/30 |
| 2019/0220151 A1* | 7/2019 | Mitsui | H10K 59/00 |
| 2020/0091458 A1* | 3/2020 | Oh | H10K 50/844 |
| 2020/0224061 A1* | 7/2020 | Oh | B32B 7/12 |
| 2020/0266368 A1* | 8/2020 | Park | H10K 77/111 |
| 2020/0301474 A1* | 9/2020 | Yug | B32B 27/08 |
| 2020/0333833 A1* | 10/2020 | Mun | G02F 1/133308 |
| 2021/0027667 A1 | 1/2021 | Lee et al. | |
| 2021/0029838 A1* | 1/2021 | Lee | G06F 1/1616 |
| 2021/0036259 A1* | 2/2021 | Song | H10K 50/87 |
| 2021/0065591 A1* | 3/2021 | Song | B32B 27/08 |
| 2021/0066640 A1* | 3/2021 | Shin | H10K 59/87 |
| 2021/0095168 A1* | 4/2021 | Kishimoto | B32B 27/288 |
| 2021/0108077 A1* | 4/2021 | Berleue | C08K 5/0025 |
| 2021/0184161 A1* | 6/2021 | Song | H10K 50/84 |
| 2021/0187904 A1* | 6/2021 | Jeong | C09J 7/29 |
| 2021/0193743 A1* | 6/2021 | Kim | G06F 1/1652 |
| 2021/0255670 A1* | 8/2021 | Lee | G06F 1/1609 |
| 2022/0221749 A1* | 7/2022 | Wu | H10K 50/86 |
| 2022/0223816 A1* | 7/2022 | Wu | B32B 17/10 |
| 2022/0282130 A1* | 9/2022 | Baby | C09J 9/00 |

FOREIGN PATENT DOCUMENTS

| | | |
|---|---|---|
| KR | 101385042 B1 | 4/2014 |
| KR | 101745849 B1 | 6/2017 |
| KR | 101809975 B1 | 12/2017 |
| KR | 101854493 B1 | 5/2018 |
| KR | 1020190083481 A | 7/2019 |
| KR | 1020200101574 A | 8/2020 |
| KR | 1020200105754 A | 9/2020 |
| KR | 1020210011552 A | 2/2021 |
| KR | 1020210075246 A | 6/2021 |

* cited by examiner

DISPLAY DEVICE INCLUDING FOLDABLE DISPLAY PANEL

This application claims to Korean Patent Application No. 10-2021-0009403, filed on Jan. 22, 2021, and all the benefits accruing therefrom under 35 U.S.C. § 119, the content of which in its entirety is herein incorporated by reference.

BACKGROUND

1. Field

Embodiments of the invention relate to a display device, and more specifically, to a foldable display device including an adhesive layer disposed under a window.

2. Description of the Related Art

A display device displays various images on a display screen to provide information to a user. Generally, the display device displays information within a given screen. Recently, a flexible display device including a display panel, which is foldable or bendable, is being developed. The flexible display device is foldable, rollable, or bendable unlike a rigid display device. The flexible display device, of which the shape may be variously changed, may be carried regardless of a screen size, thereby improving user's convenience.

An adhesive layer applied to a flexible display device has to maintain reliability even after repeated folding or bending.

SUMMARY

Embodiments of the invention provide a display device capable of maintaining reliability even after repeated folding and unfolding.

An embodiment of the invention provides a display device including a display panel that is foldable with reference to at least one folding axis, a polarization layer disposed on the display panel, an adhesive layer disposed on the polarization layer, and a window disposed on the adhesive layer, and including one surface facing the adhesive layer, where a 180 degree) (°) peel adhesion of the adhesive layer to the one surface of the window is about 493 gram-force per inch (gf/inch) to about 817 gf/inch under conditions of a temperature of about 60 degrees Celsius (° C.) and a relative humidity of about 93 percent (%).

In an embodiment, the adhesive layer may include an acrylic resin and a silane coupling agent.

In an embodiment, the one surface of the window may be one surface of a glass substrate, and a 180° peel adhesion of the adhesive layer to the one surface may be about 493 gf/inch to about 556 gf/inch.

In an embodiment, the one surface of the window may be one surface of a plasma-treated glass substrate, and a 180° peel adhesion of the adhesive layer to the one surface may be about 636 gf/inch to 817 gf/inch.

In an embodiment, when a stress of about 1,900 pascals (Pa) to about 2,000 Pa is applied for about 10 minutes to the adhesive layer under the conditions of the temperature of about 60° C. and the relative humidity of about 93%, a creep value of the adhesive layer may be about 16% to about 18%.

In an embodiment, when a stress of about 1,900 Pa to about 2,000 Pa is applied for about 10 minutes to the adhesive layer under the conditions of a temperature of about 60° C. and a relative humidity of about 93%, a residual strain of the adhesive layer after an elapse of additional about 10 minutes may be about 0.6% to about 0.9%, and a recovery rate of the adhesive layer may be about 95% to about 96%.

In an embodiment, when a stress of about 9,900 Pa to about 12,210 Pa is applied for about 10 minutes to the adhesive layer under the conditions of the temperature of about 60° C. and the relative humidity of about 93%, a creep value of the adhesive layer may be about 94% to about 101%.

In an embodiment, when a stress of about 9,900 Pa to about 12,210 Pa is applied for about 10 minutes to the adhesive layer under the conditions of the temperature of about 60° C. and the relative humidity of about 93%, a residual strain of the adhesive layer after an elapse of additional about 10 minutes may be about 3% to about 4%, and a recovery rate of the adhesive layer may be about 95% to about 96%.

In an embodiment, a thickness of the adhesive layer may be about 10 micrometers (μm) to about 70 μm.

In an embodiment, the adhesive layer may include a polymer resin having a glass transition temperature of about −40° C. or less.

In an embodiment, the polarization layer may have a Young's modulus of about 9,600 megapascals (MPa) to about 9,800 MPa at a temperature of about −20° C., and a Young's modulus of about 6,900 MPa to about 7,100 MPa at the temperature of about 60° C.

In an embodiment, the polarization layer may have a Young's modulus of about 8,300 MPa to about 8,500 MPa under the conditions of a room temperature and a relative humidity of about 40% to about 50%, and a Young's modulus of about 3,200 MPa to about 3,400 MPa under the conditions of a temperature of about 60° C. and a relative humidity of about 93%.

In an embodiment, the display device is in-foldable with reference to the at least one folding axis.

In an embodiment, the display device may further include a shock absorbing layer disposed between the adhesive layer and the polarization layer, where the shock absorbing layer may have a Young's modulus of about 5,500 MPa to about 6,600 MPa at a temperature of about −20° C., and a Young's modulus of about 4,300 MPa to about 5,100 MPa at the temperature of about 60° C.

In an embodiment, the shock absorbing layer may have a Young's modulus of about 5,000 MPa to about 5,900 MPa under the conditions of a room temperature and a relative humidity of about 40% to about 50%, and a Young's modulus of about 3,900 MPa to about 4,700 MPa under the conditions of the temperature of about 60° C. and the relative humidity of about 93%.

In an embodiment, the display device may further include at least one functional layer disposed under the display panel, and an auxiliary adhesive layer disposed under the at least one functional layer, where the 180° peel adhesion of the auxiliary adhesive layer to the at least one functional layer may be about 493 gf/inch to about 817 gf/inch under the conditions of the temperature of about 60° C. and the relative humidity of about 93%.

An embodiment of the invention provides a display device including a display panel that is foldable with reference to at least one folding axis, a polarization layer disposed on the display panel, an adhesive layer disposed on the polarization layer, and a window disposed on the adhesive layer, and including one surface facing the adhesive layer, where, when a stress of about 1,900 Pa to about 2,000 Pa is applied for about 10 minutes to the adhesive layer under conditions of a temperature of about 60° C. and a relative humidity of about 93%, the adhesive layer has a creep value of about 16% to about 18%, and, when a stress of about 9,900 Pa to about 12,210 Pa is applied for about 10 minutes to the adhesive layer under the conditions of the temperature of about 60° C. and the relative humidity of about 93%, the adhesive layer has a creep value of about 94% to about 101%.

In an embodiment, a 180° peel adhesion of the adhesive layer to the one surface of the window may be about 493 gf/inch to about 817 gf/inch under the conditions of the temperature of 60° C. and the relative humidity of about 93%.

In an embodiment, the adhesive layer may include at least one among trimethoxy(3-(oxiranyl-2-methoxy)propyl) silane, 3-glycidoxy propyl trimethoxy silane, 3-glycidoxy propyl triethoxy silane, 3-(2,3-epoxypropoxypropyl)methyldimethoxysilane, 3-(2,3-epoxypropoxypropyl)methyldiethoxysilane, 2-(3,4-epoxycyclohexyl)ethylmethyldimethoxysilane, and 2-(3,4-epoxycyclohexyl) ethyltrimethoxysilane.

In an embodiment, the window may include a glass substrate, and the window may further include a protective layer disposed on the glass substrate.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1:
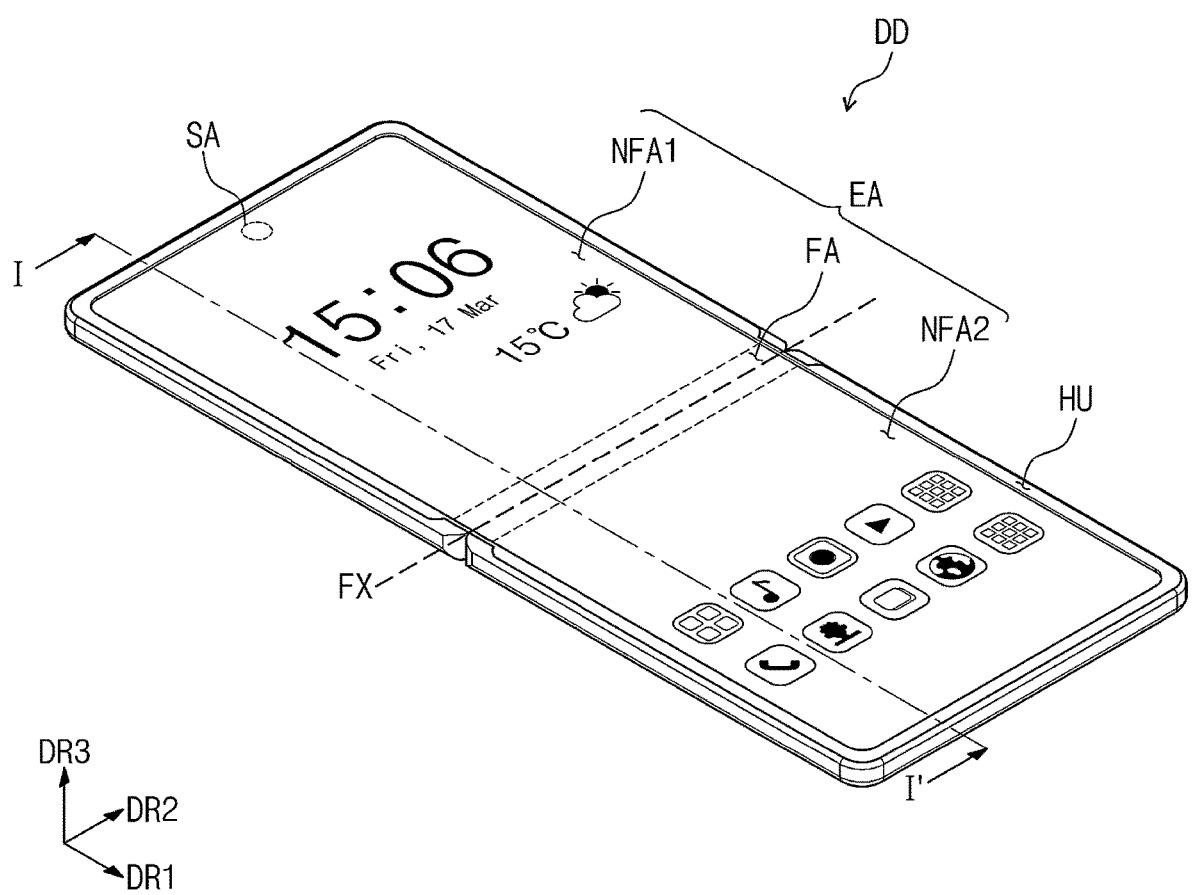
FIG. 1 is a perspective view illustrating a display device of an embodiment.

The invention may be modified in many alternate forms, and thus specific embodiments will be exemplified in the drawings and described in detail in the text. It should be understood, however, that it is not intended to limit the invention to the particular forms disclosed, but rather, is intended to cover all modifications, equivalents, and alternatives falling within the spirit and scope of the invention.

In the specification, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals refer to like elements. Also, in the drawings, the thickness, the ratio, and the dimensions of elements are exaggerated for an effective description of technical contents.

The term "and/or," includes all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of embodiments of the invention. The terms of a singular form may include plural forms unless the context clearly indicates otherwise.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the invention pertains. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprise", or "have" are intended to specify the presence of stated features, integers, processes, operations, elements, components, or combinations thereof in the invention, but do not preclude the presence or addition of one or more other features, integers, processes, operations, elements, components, or combinations thereof.

Hereinafter, a display device of an embodiment of the invention will be described with reference to the accompanying drawings.

Figure 2:
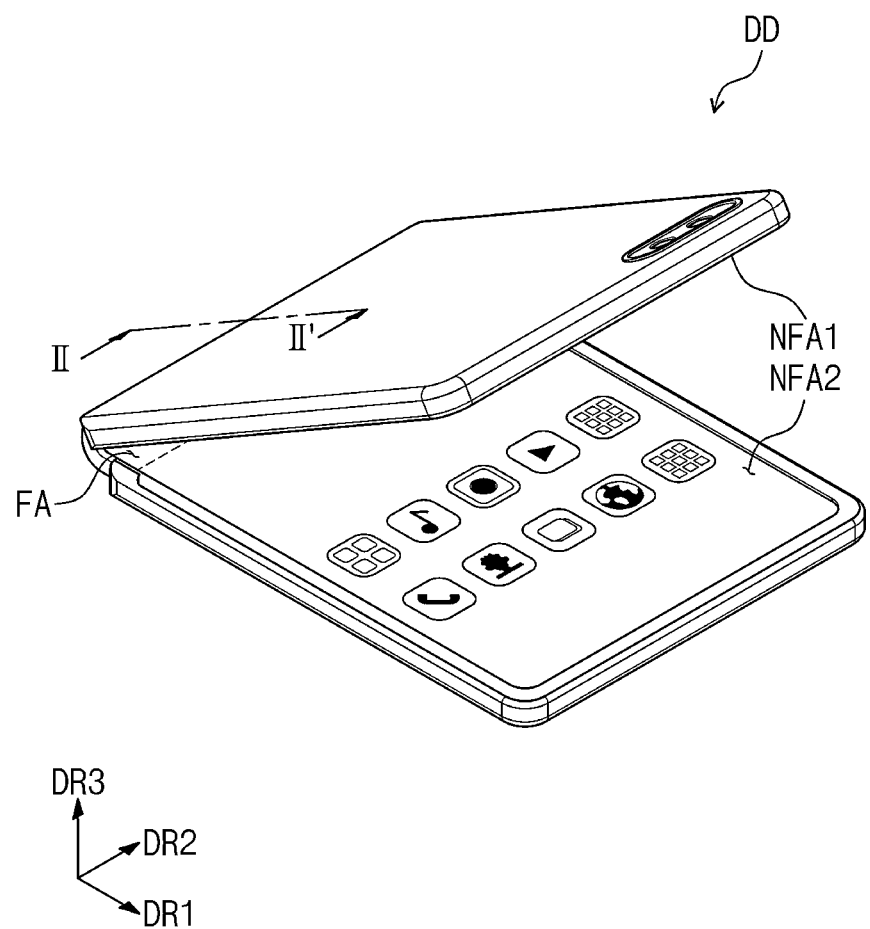
FIG. 2 is a perspective view illustrating a display device of an embodiment.

FIG. 1 and FIG. 2 are perspective views illustrating a display device DD of an embodiment. FIG. 1 illustrates a state in which the display device DD is unfolded, and FIG. 2 illustrates a state in which the display device DD is folded. The display device DD in an embodiment may be a flexible display device that is foldable or bendable, or may be maintained in a folded state or bent state.

Referring to FIG. 1 and FIG. 2, the display device DD may be a device activated in response to an electrical signal. In an embodiment, the display device DD may be a personal digital assistant, a tablet, a car navigation unit, a game console, or a wearable device, for example, but is not limited thereto. In FIG. 1 and FIG. 2, a portable electronic device is illustrated as the display device DD.

The display device DD may display an image through an active area EA. The active area EA may include non-folding areas NFA1 and NFA2, and a folding area FA. The folding area FA may be bent with reference to a folding axis FX, which is parallel to a direction in which a second directional axis DR2 extends.

When the display device DD is folded, the non-folding areas NFA1 and NFA2 may face each other. In a fully folded state, the active area EA may not be exposed to the outside, which may be referred to as in-folding. However, this is illustrated as an example, and the operation of the display device DD is not limited thereto.

The display device DD may be able to perform only one operation among an in-folding operation and an out-folding operation. In an alternative embodiment, the display device DD may be able to perform both the in-folding operation and the out-folding operation. In this case, the same area of the display device DD such as the folding area FA may be in-folded and out-folded. In an alternative embodiment, a portion of an area of the display device DD may be in-folded, and the other portion of the area may be out-folded.

The display device DD of FIG. 1 and FIG. 2 is illustrated to include one folding area FA and two non-folding areas NFA1 and NFA2, but the numbers of folding areas FA and non-folding areas are not limited thereto. In an embodiment, the display device may include at least three non-folding areas and at least two folding areas disposed between the non-folding areas adjacent to each other, for example.

In FIG. 1 and FIG. 2, the folding axis FX is illustrated to be parallel to the short axis of the display device DD, that is, a direction in which the second directional axis DR2 extends. However, this is illustrated as an example, and the invention is not limited thereto. In an embodiment, the folding axis may also be parallel to the long axis of the display device DD, that is, a direction in which a first directional axis DR1 extends, for example.

The display device DD may include a sensing area SA surrounded by the active area EA. In an embodiment, the sensing area SA may overlap with a camera module. Although one sensing area SA is illustrated in FIG. 1, for example, the invention is not limited thereto. The display device of an embodiment may include a plurality of sensing areas.

The display device DD may include a case HU. The case HU may accommodate a display panel DP and a window WN which will be described later.

Although FIG. 1 and FIG. 2 illustrate that the display device DD of an embodiment is a foldable display device, the invention is not limited thereto. The display device in an embodiment may be a flexible display device that is foldable or bendable, or may be maintained in a folded state or bent state. In the specification, the term 'flexible' indicates a property of being bendable, and may not be limited to a structure being completely foldable, but may include a structure being bendable to a degree of a few nanometers.

The display device DD may have a three-dimensional shape having a predetermined thickness in a direction of a third directional axis DR3 perpendicular to a plane defined by the first directional axis DR1 and the second directional axis DR2 crossing the first directional axis DR1. In the specification, an upper surface (of a front surface) and a lower surface (or a rear surface) of each member are defined on the basis of a direction in which an image is displayed on the active area EA. The upper surface and the lower surface may be opposed to each other in the third directional axis DIU, and the normal direction of each of the upper surface and the lower surface may be parallel to the third directional axis DR3. Directions indicated by the first to third directional axes DR1, DR2, and DR3 are relative concepts, and may thus be changed to other directions. Hereinafter, first to third directions are regarded as the directions indicated respectively by the first to third directional axes DR1, DR2, and DR3, and the same reference numerals should be referred to.

Figure 3:
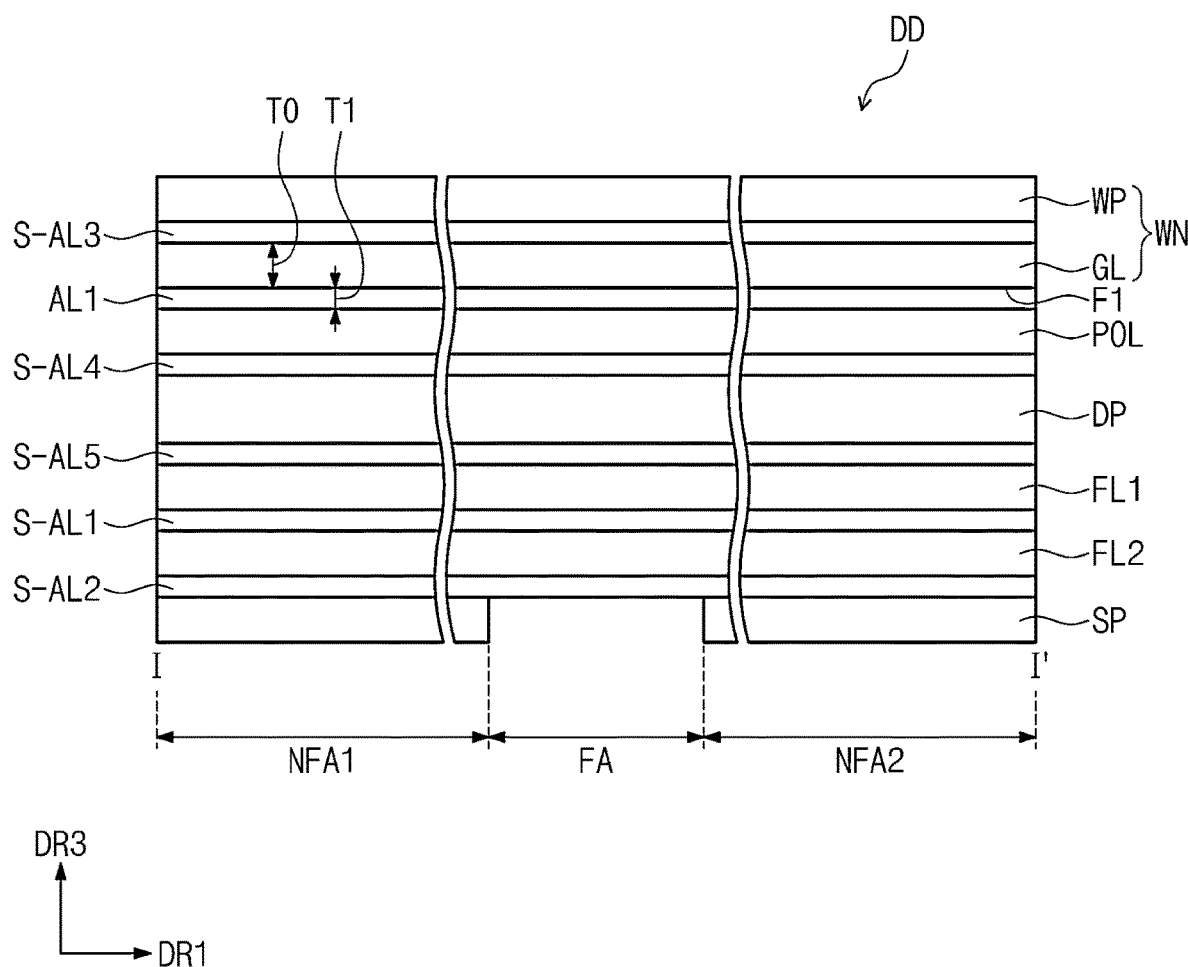
FIG. 3 is a cross-sectional view taken along line I-I' of FIG. 1.
Figure 4:
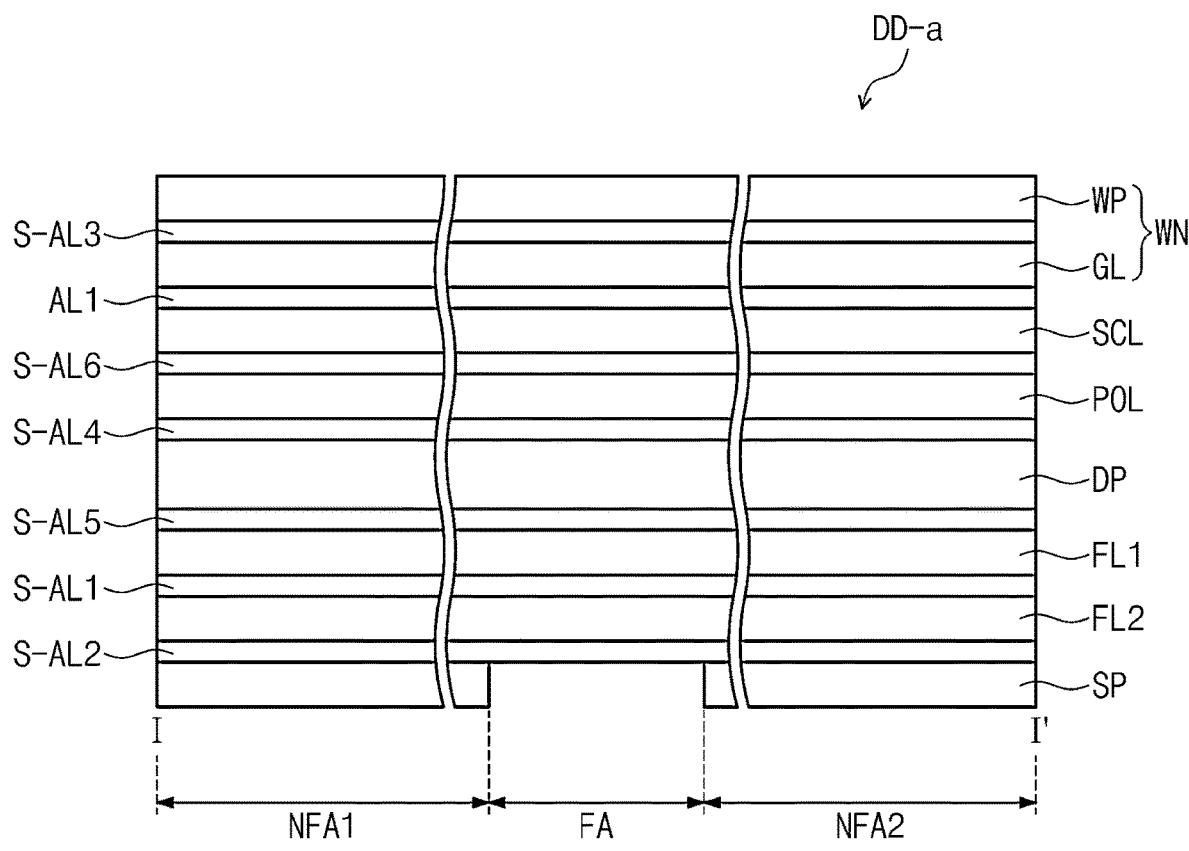
FIG. 4 is a cross-sectional view illustrating an embodiment of a display device.

FIG. 3 is a cross-sectional view taken along line I-I' of FIG. 1. FIG. 4 is a cross-sectional view illustrating another embodiment of a display device DD-a according to the invention. Compared with FIG. 3, FIG. 4 illustrates that the display device DD-a further includes a shock absorbing layer SCL between a window WN and a polarization layer POL.

In embodiment, the display devices DD and DD-a may each include a display panel DP, a polarization layer POL disposed on the display panel DP, an adhesive layer AL1 disposed on the polarization layer POL, and a window WN disposed on the adhesive layer AL1. The display panel DP may be foldable with reference to at least one folding axis FX. The display panel DP may be foldable with reference to the aforementioned folding axis FX.

The window WN may include a glass substrate GL. In addition, the window WN may further include a protective layer WP disposed on the glass substrate GL. The thickness T0 of the glass substrate GL may be about 10 μm to about 80 μm. The glass substrate GL may be a tempered glass. The protective layer WP may be disposed on a front surface of the display device DD. The protective layer WP may allow an image provided from the display panel DP to be transmitted as it is, and protect the glass substrate GL from an external impact.

In an embodiment, the protective layer WP may be a film including at least one resin among a polyethylene terephthalate ("PET"), polybutylene terephthalate ("PBT"), polyethylene naphthalene ("PEN"), polycarbonate ("PC"), poly(methylmethacrylate) ("PMMA"), polystyrene ("PS"), polyvinylchloride ("PVC"), polyethersulfone ("PES"), polypropylene ("PP"), polyamide ("PA"), modified polyphenylene ether ("m-PPE"), polyoxymethylene ("POM"), polysulfone ("PSU"), polyphenylene sulfide ("PPS"), polyimide ("PI"), polyethyleneimine ("PEI"), polyether ether ketone ("PEEK"), polyamideimide ("PAI"), polyarylate ("PAR"), or a thermoplastic polyurethane ("TPU").

In an embodiment, the window WN may include one surface F1 facing the adhesive layer AL1. The one surface F1 of the window WN may be in contact with the adhesive layer AL1. A 180 degree) (°) peel adhesion of the adhesive layer AL1 to the one surface F1 of the window WN may be about 493 gram-force per inch (gf/inch) to about 817 gf/inch under the conditions of a temperature of about 60 degrees Celsius (° C.) and a relative humidity of about 93 percent (%). In the specification, the 180° peel adhesion is the value as measured through a method in which a peel angle is about 180° and a tensile speed is about 300 millimeters per minute (mm/min).

In an embodiment, the one surface F1 of the window WN may include a glass. The one surface F1 of the window WN may be one surface F1 of the glass substrate GL. When the one surface F1 of the window WN is the one surface F1 of the glass substrate GL, a 180° peel adhesion of the adhesive layer AL1 to the one surface F1 of the window WN may be about 493 gf/inch to about 556 gf/inch. A 180° peel adhesion of the adhesive layer AL1 to the one surface F1 of a window WN which is not surface-modified, may be about 493 gf/inch to about 556 gf/inch. In an embodiment, the 180° peel adhesion of the adhesive layer AL1 to the one surface F1 of the window WN which is not surface-modified, may be about 493.9 gf/inch to about 555.4 gf/inch, for example. The one surface F1 of the window WN which is not surface-modified may not be plasma-treated.

In an alternative embodiment, the one surface F1 of the window WN may be plasma-treated. The plasma-treated one surface F1 of the window WN may be surface-modified. The one surface F1 of the window WN which is surface-modified may be the glass substrate GL of which the one surface F1 is plasma-treated. In an embodiment, the one surface F1 of the window WN which is surface-modified through nitrogen plasma treatment may have improved adhesion to the adhesive layer by nitrogen atoms, for example. A 180° peel adhesion of the adhesive layer AL1 to the one surface F1 of the window WN which is surface-modified may be about 636 gf/inch to about 817 gf/inch. In an embodiment, the 180° peel adhesion of the adhesive layer AL1 to the one surface F1 of the window WN which is surface-modified may be about 636.5 gf/inch to about 816.9 gf/inch, for example. As the one surface F1 of the window WN is surface-modified through the plasma treatment, the adhesion of the adhesive layer AL1 to the one surface F1 of the window WN may be improved.

When the 180° peel adhesion of the adhesive layer to the one surface of the window is less than about 493 gf/inch under the conditions of a temperature of about 60° C. and a relative humidity of about 93%, the window and the adhesive layer may be peeled off. In addition, when the 180° peel adhesion of the adhesive layer to the one surface of the window is more than about 817 gf/inch under the conditions of a temperature of about 60° C. and a relative humidity of about 93%, it may not be easy to fold the display device.

In an embodiment, the thickness T1 of the adhesive layer AL1 may be about 10 μm to about 70 μm. The adhesive layer AL1 may include a pressure sensitive adhesive ("PSA"). The adhesive layer AL1 may be optically transparent. The adhesive layer AL1 may include a polymer resin having a glass transition temperature of about −40° C. or less. The adhesive layer AL1 may include an acrylic resin and a silane coupling agent ("SCA"). The adhesive layer AL1 may include an acrylic resin having a glass transition temperature of about −40° C. or less. The acrylic resin may include an acrylate monomer. In an embodiment, the adhesive layer AL1 may include at least one SCA among 3-glycidoxypropyltrimethoxysilane, 3-glycidoxypropyltriethoxysilane, 3-(2,3-epoxyprofoxypropyl)methyldimethoxysilane, 3-(2,3-epoxypropoxypropyl)methyldiethoxysilane, 2-(3,4-epoxycyclohexyl)ethylmethyldimethoxysilane, and 2-(3,4-epoxycyclohexyl)ethyltrimethoxysilane, for example. However, this is illustrated as an example, and the type of the SCA included in the adhesive layer AL1 is not limited thereto.

In an embodiment, when a stress of about 1,900 Pa to about 2,000 Pa is applied for about 10 minutes to the adhesive layer AL1 under the conditions of a temperature of about 60° C. and a relative humidity of about 93%, a creep value of the adhesive layer AL1 may be about 16% to about 18%. In an embodiment, when a stress of about 1,900 Pa to about 2,000 Pa is applied for about 10 minutes to the adhesive layer AL1 under the conditions of a temperature of about 60° C. and a relative humidity of about 93%, the creep value of the adhesive layer AL1 may be about 16.29% to about 17.12%, for example.

When a stress of about 1,900 Pa to about 2,000 Pa is applied for about 10 minutes to the adhesive layer AL1 under the conditions of a temperature of about 60° C. and a relative humidity of about 93%, a residual strain of the adhesive layer AL1 after the elapse of about 10 minutes may be about 0.6% to about 0.9%. When a stress of about 1,900 Pa to about 2,000 Pa is applied for about 10 minutes to the adhesive layer AL1 under the conditions of a temperature of about 60° C. and a relative humidity of about 93%, a recovery rate of the adhesive layer AL1 after the elapse of about 10 minutes may be about 95% to about 96%. A strain of the adhesive layer AL1 and a recovery rate of the adhesive layer AL1 may be defined as a strain and a recovery rate which are obtained after the elapse of about 10 minutes from removal of the applied stress. In an embodiment, when a stress of about 1,900 Pa to about 2,000 Pa is applied for about 10 minutes to the adhesive layer AL1 under the conditions of a temperature of about 60° C. and a relative humidity of about 93%, a residual strain of the adhesive layer AL1 after the elapse of about 10 minutes may be about 0.66% to about 0.82%, and a recovery rate of the adhesive layer AL1 may be about 95.23% to about 95.93%, for example.

In an embodiment, when a stress of about 9,900 Pa to about 12,210 Pa is applied for about 10 minutes to the adhesive layer, a creep value of the adhesive layer AL1 may be about 94% to about 101%. The stress of about 9,900 Pa to about 12,210 Pa corresponds to a stress satisfying the linear viscoelastic region ("LVR") condition.

The adhesive layer AL1 of an embodiment may include a polymer resin exhibiting viscoelastic properties. A polymer exhibits viscoelastic properties, and when a strain sweep test is performed on the polymer, the LVR may be confirmed.

Figure 5:
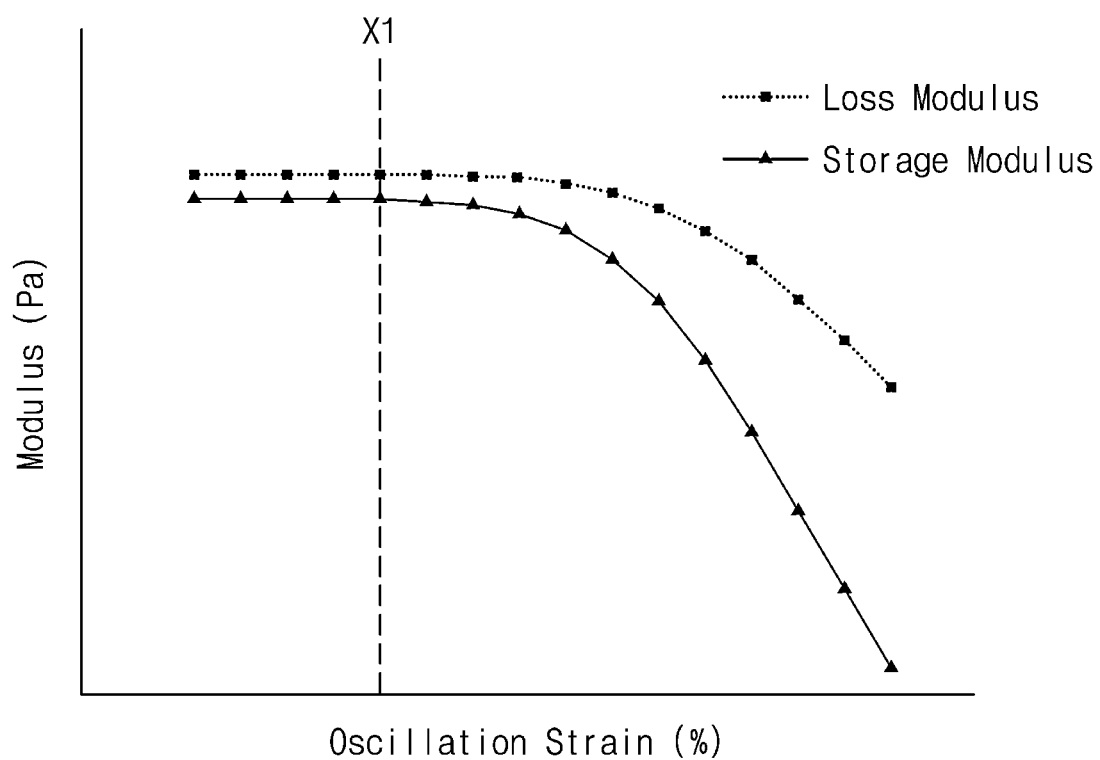
FIG. 5 is a graph showing modulus versus oscillation strain.

FIG. 5 is a graph showing the measurements of modulus by performing a strain sweep test on a polymer. FIG. 5 shows the measurements of storage modulus and loss modulus when the strain is continuously increased.

Referring to FIG. 5, the horizontal axis represents an oscillation strain in terms of percentage and the vertical axis represents modulus in terms of pascal, and it may be seen that modulus in the left region of line X1 shows a linear behavior and modulus in the right region of line X1 shows a non-linear behavior. The left region of line X1 may be a region correspond to the LVR.

The LVR may be a region that satisfies the strain condition of a region in which a reduction degree of moduli (storage modulus and loss modulus) is about 5% compared to initial moduli (storage modulus and loss modulus). When a stress that satisfies a strain condition beyond the LVR is applied to the polymer, the polymer is permanently deformed and thus does not recover even after the stress is removed. Therefore, the stress of about 9,900 Pa to about 12,210 Pa may be a strain condition under which a reduction degree in moduli (storage modulus and loss modulus) is about 5% or less compared to initial moduli (storage modulus and loss modulus) in the adhesive layer AL1 in an embodiment.

When a stress of about 9,900 Pa to about 12,210 Pa is applied for about 10 minutes to the adhesive layer AL1 under the conditions of a temperature of about 60° C. and a relative humidity of about 93%, a residual strain of the adhesive layer AL1 after the elapse of about 10 minutes may be about 3% to about 4%. In addition, when a stress of about 9,900 Pa to about 12,210 Pa is applied for about 10 minutes to the adhesive layer AL1 under the conditions of a temperature of about 60° C. and a relative humidity of about 93%, a recovery rate of the adhesive layer AL1 after the elapse of about 10 minutes may be about 95% to about 96%. In an embodiment, when a stress of about 9,900 Pa to about 12,210 Pa is applied for about 10 minutes to the adhesive layer AL1 under the conditions of a temperature of about 60° C. and a relative humidity of about 93%, a residual strain of the adhesive layer AL1 after the elapse of about 10 minutes may be about 3.87% to about 4.72%, for example. When a stress of about 9,900 Pa to about 12,210 Pa is applied for about 10 minutes to the adhesive layer AL1 under the conditions of a temperature of about 60° C. and a relative humidity of about 93%, a recovery rate of the adhesive layer AL1 after the elapse of about 10 minutes may be about 95.22% to about 95.89%.

When folding and unfolding are repeated in a display device including an adhesive layer having a recovery rate of less than about 95% under the conditions of a temperature of about 60° C. and a relative humidity of about 93%, the adhesive layer may be completely deformed. In addition, when folding and unfolding are repeated in a display device including an adhesive layer having a residual strain of more than about 4% under the conditions of a temperature of about 60° C. and a relative humidity of about 93%, the adhesive layer may be completely deformed. When the adhesive layer is completely deformed, the reliability of the display device may be deteriorated.

A typical display device includes an adhesive layer and a primer layer between a window and a polarization layer. A typical display device includes an adhesive layer disposed on a polarization layer and a primer layer disposed on the adhesive layer. The primer layer is for increasing the adhesion of the adhesive layer to the window. When the display device includes the primer layer, a separate process was desired for forming the primer layer in a display device manufacturing method.

Sine the display devices DD and DD-a in an embodiment do not include a primer layer, time and cost desired to form the primer layer may be shortened and reduced. In the display devices DD and DD-a in an embodiment, since the adhesive layer AL1 disposed between the polarization layer POL and the window WN includes a SCA, the adhesion of the adhesive layer AL1 to the window WN may be improved. In addition, the adhesive layer AL1 including the SCA may exhibit improved characteristics of a 180° peel adhesion to the window WN under the conditions of a temperature of about 60° C. and a relative humidity of about 93%. The adhesive layer AL1 including the SCA may exhibit excellent characteristics of a strain and a recovery rate when an external force is applied. Accordingly, the display devices DD and DD-a including the adhesive layer AL1 in embodiments may keep the reliability thereof even after repeated folding and unfolding. In addition, the display devices DD and DD-a may exhibit good durability under the conditions of high temperature and high humidity.

Referring back to FIG. 3 and FIG. 4, the display devices DD and DD-a in embodiments may include the polarization layer POL under the adhesive layer AL1. The polarization layer POL may have a Young's modulus of about 9,600 megapascals (MPa) to about 9,800 MPa at a temperature of about −20° C. The polarization layer POL may have a Young's modulus of about 6,900 MPa to about 7,100 MPa at a temperature of about 60° C. In addition, the polarization layer POL may have a Young's modulus of about 8,300 MPa to about 8,500 MPa under the conditions of a room temperature and a relative humidity of about 40% to about 50%. In the specification, a room temperature is a temperature in the range of about 23° C. to about 28° C. The polarization layer POL may have a Young's modulus of about 3,200 MPa to about 3,400 MPa under the conditions of a temperature of about 60° C. and a relative humidity of about 93%.

Referring to FIG. 4, the display device DD-a in an embodiment may further include the shock absorbing layer SCL disposed between the adhesive layer AL1 and the polarization layer POL. In an embodiment, the shock absorbing layer SCL may have a Young's modulus of about 5,500 MPa to about 6,600 MPa at a temperature of about −20° C. The shock absorbing layer SCL may have a Young's modulus of about 4,300 MPa to about 5,100 MPa at a temperature of 60° C. In an embodiment, the shock absorbing layer SCL may exhibit a Young's modulus of about 4,300 MPa to about 5,100 MPa at a temperature of about 60° C., and a relative humidity of about 40% to about 50%, for example. However, this is illustrated as an example, and the relative humidity condition at a temperature of about 60° C. is not limited thereto.

In addition, the shock absorbing layer SCL may have a Young's modulus of about 5,000 MPa to about 5,900 MPa under the conditions of a room temperature and a relative humidity of about 40% to about 50%. The shock absorbing layer SCL may have a Young's modulus of about 3,900 MPa to about 4,700 MPa under the conditions of a temperature of about 60° C. and a relative humidity of about 93%. Under the aforementioned conditions of the temperature and relative humidity, the shock absorbing layer SCL satisfying each Young's modulus range may exhibit good bonding strength with the adhesive layer AL1.

The shock absorbing layer SCL may protect the display panel DP from an external impact. The shock absorbing layer SCL may be produced in the form of a stretched film. The shock absorbing layer SCL may include a polymer resin. In an embodiment, the shock absorbing layer may include a resin such as PI or PET, and may thus have flexibility, for example.

The display devices DD and DD-a in an embodiment may include a display panel DP. The display panel DP may be a light-emitting display panel, and is not particularly limited. In an embodiment, the display panel DP may be an organic light-emitting display panel or a quantum dot light-emitting display panel, for example. A light-emitting layer of the organic light-emitting display panel may include an organic light-emitting material. The light-emitting layer of the quantum dot light-emitting display panel may include a quantum dot and a quantum rod, etc.

At least one of functional layers FL1 and FL2 may be disposed under the display panel DP. In addition, auxiliary adhesive layers S-AL1 and S-AL2 may be disposed under the at least one of the functional layers FL1 and FL2. A first functional layer FL1 and a second functional layer FL2 may be disposed under the display panel DP.

The first functional layer FL1 may be disposed under the display panel DP. The first functional layer FL1 may be a protective substrate. The first functional layer FL1 may protect the lower portion of the display panel DP. The first functional layer FL1 may include a plastic material. In an embodiment, the first functional layer FL1 may include PET, for example.

The second functional layer FL2 may be disposed between the first functional layer FL1 and a support member SP. The second functional layer FL2 may be a cushion layer. The second functional layer FL2 may protect the display panel DP by absorbing an external impact applied to the lower portions of the display devices DD and DD-a. The second functional layer FL2 may include a foam sheet having a predetermined elastic force.

A first auxiliary adhesive layer S-AL1 may be disposed between the first functional layer FL1 and the second functional layer FL2. A second auxiliary adhesive layer S-AL2 may be disposed under the second functional layer FL2. At least one of the first auxiliary adhesive layer S-AL1 or the second auxiliary adhesive layer S-AL2 may have a 180° peel adhesion to the functional layers FL1 and FL2 of about 493 gf/inch to about 817 gf/inch under the conditions of a temperature of about 60° C. and a relative humidity of about 93%. In an embodiment, the 180° peel adhesion of the first auxiliary adhesive layer S-AL1 to the first functional layer FL1 may be about 493 gf/inch to about 817 gf/inch, for example. In addition, the 180° peel adhesion of the second auxiliary adhesive layer S-AL2 to the second functional layer FL2 may be about 493 gf/inch to about 817 gf/inch. At least one of the first auxiliary adhesive layer S-AL1 or the second auxiliary adhesive layer S-AL2 may have a 180° peel adhesion to the functional layers FL1 and FL2 that is equal to the 180° peel adhesion of the adhesive layer AL1. However, this is illustrated as an example, and the invention is not limited thereto.

The support member SP may be disposed under the second functional layer FL2. The support member SP may support the display panel DP. The support member SP may not overlap with the folding area FA. The support member SP may overlap the non-folding areas NFA1 and NFA2. The support member SP may include metal. In an embodiment, the support member SP may include stainless steel, aluminum, or an alloy thereof, for example. The strength of the support member SP may be higher than the strength of the display panel DP.

A third auxiliary adhesive layer S-AL3 may be disposed between the glass substrate GL and the protective layer WP. A fourth auxiliary adhesive layer S-AL4 may be disposed between the polarization layer POL and the display panel DP. A fifth auxiliary adhesive layer S-AL5 may be disposed between the display panel DP and the first functional layer FL1. In addition, a sixth auxiliary adhesive layer S-AL6 may be disposed between the shock absorbing layer SCL and the polarization layer POL. The first to sixth auxiliary adhesive layers S-AL1, S-AL2, S-AL3, S-AL4, S-AL5, and S-AL6 may each include any one of a PSA film, an optically clear adhesive ("OCA") film, or an optically clear resin ("OCR"). In an embodiment, the first auxiliary adhesive layer to sixth auxiliary adhesive layer S-AL1, S-AL2, S-AL3, S-AL4, S-AL5, and S-AL6 may each include a PSA film, for example. The first to sixth auxiliary adhesive layers S-AL1, S-AL2, S-AL3, S-AL4, S-AL5, and S-AL6 may each include at least one of a silicone-based resin, an acrylic-based resin, or a urethane-based resin.

Figure 6:
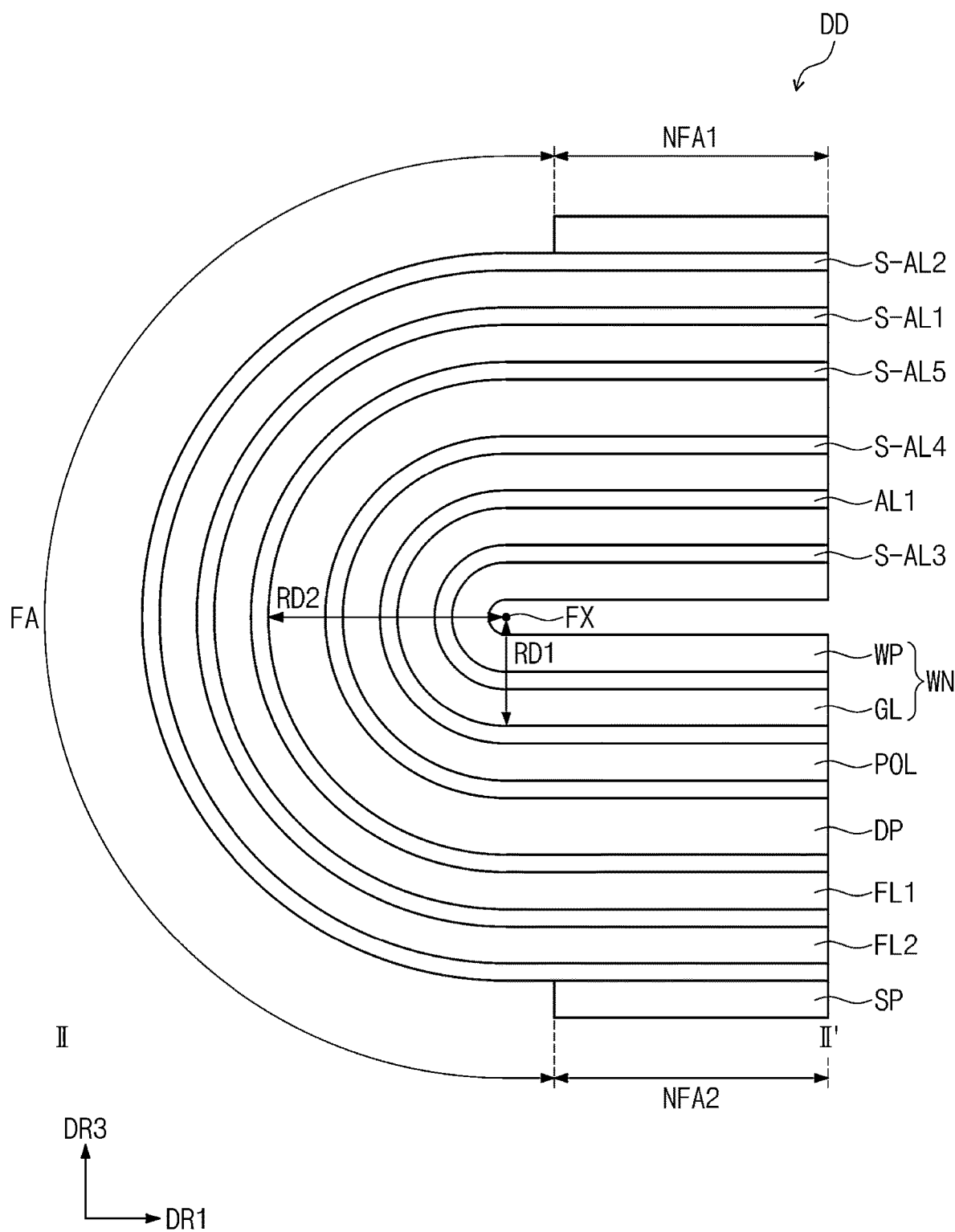
FIG. 6 is a cross-sectional view taken along line II-II' of FIG. 2.

FIG. 6 is a cross-sectional view taken along line II-II' of FIG. 2. FIG. 6 illustrates a case in which the display device DD in an embodiment is in-folded. The display device DD in an embodiment may be in-foldable with reference to at least one folding axis FX. The one surface of the display panel DP and the one surface of the window WN may be folded, respectively, during folding of the display device DD. In the in-folded display device DD, the facing surfaces of the folded window WN may be closer to each other than the facing surfaces of the folded display panel DP. The one surface of the display panel DP may be an upper surface of the display panel DP, and the one surface of the window WN may be an upper surface of the window WN.

In the display devices DD and DD-a in an embodiment, the display panel DP and the window WN may be folded with reference to the folding axis FX so as to respectively have radii of curvature RD1 and RD2 of about 1 mm to about 5 mm. In an embodiment, the display panel DP and the window WN may be folded with reference to the folding axis FX to have a radius of curvature of about 1.5 mm, for example. However, this is illustrated as an example, and the radii of curvature RD1 and RD2 in the display devices DD and DD-a in an embodiment are not limited thereto. In the display device DD in a folded state, the adhesive layer AL1 in an embodiment may contribute to maintaining the reliability of the display device DD. The adhesive layer AL1 having a 180° peel adhesion to the window WN of about 493 gf/inch to about 817 gf/inch may contribute to maintaining reliability during folding of the display device DD.

The following Table 1 shows measurements of a 180° peel adhesion in the adhesive layers of Comparative Examples and Experimental Examples. The adhesion was measured three times for the adhesive layers of each of Comparative Examples and Experimental Examples before and after plasma treatment. In Comparative Example 1 and Experimental Example 1, the 180° peel adhesion of the adhesive layer before plasma treatment was measured. In Comparative Example 2 and Experimental Example 2, the 180° peel adhesion of the adhesive layer after plasma treatment was measured. During plasma treatment, clean dry air ("CDA") was supplied at a flow rate of 2.4 liters per minute ("LPM"), nitrogen gas ($N_2$ gas) was supplied at a flow rate of about 350 LPM, and the plasma process was performed at a speed of about 30 millimeters per second (mm/sec) to about 50 mm/sec.

In Comparative Examples 1 and 2, the 180° peel adhesion of an adhesive layer not including a SCA was measured. In Experimental Examples 1 and 2, the 180° peel adhesion of an adhesive layer including a SCA in an embodiment was measured.

Measurement of each peel adhesion was performed such that the 180° peel adhesion measured at a speed of 300 mm/min by a universal testing machine ("UTM") under the conditions of a temperature of about 60° C. and a relative humidity of about 93%. Adhesive layers of Comparative Examples and Experimental Examples were prepared as 25-mm samples, and the samples were attached to adherends by causing a 2,000±50 g roller to roll back and forth one time. Then, the peel adhesion was measured after the elapse of 12 hours.

TABLE 1

| Division | Number of measurements | Comparative Example 1 | Comparative Example 2 | Experimental Example 1 | Experimental Example 2 |
|---|---|---|---|---|---|
| 180° peel adhesion (gf/inch) | 1 | 266 | 458.8 | 555.4 | 816.9 |
| | 2 | 201.8 | 192.9 | 493.9 | 732.4 |
| | 3 | 171.6 | 159 | 528.6 | 636.5 |

Referring to Table 1, it may be seen that the adhesive layer of Experimental Example 1 has more improved adhesion than the adhesive layer of Comparative Example 1.

In addition, it may be seen that the adhesive layer of Experimental Example 2 has more improved adhesion than the adhesive layer of Comparative Example 2. It may be determined that the adhesive layers of Experimental Example 1 and Experimental Example 2 each including a SCA exhibit more improved adhesion characteristics than the adhesive layers of Comparative Examples 1 and 2 not including the SCA. It may be seen that the adhesive layer of Experimental Example 1 has an adhesion of about 493 gf/inch to about 556 gf/inch under the conditions of a temperature of about 60° C. and a relative humidity of about 93%. In addition, it may be seen that the plasma-treated adhesive layer of Experimental Example 2 has an adhesion of about 636 gf/inch to about 817 gf/inch under the conditions of a temperature of about 60° C. and a relative humidity of about 93%. Accordingly, the adhesive layer including the SCA in an embodiment may exhibit improved adhesion under the conditions of a temperature of about 60° C. and a relative humidity of about 93%. The display device including the adhesive layer in an embodiment may maintain the reliability thereof under the conditions of a temperature of about 60° C. and a relative humidity of about 93%.

Table 2 and Table 3 show that the creep value, residual strain, and recovery rate of each of adhesive layers of Comparative Examples and Experimental Examples that have been processed in the form of a disk with a diameter of about 8 mm and thickness of about 800 μm. The creep values, residual strains, and recovery rates were each measured, by a rheometer (TA Instruments, Inc.) under the conditions of a temperature of about 60° C. and a relative humidity of about 93%.

Table 2 shows measurements of the creep values of the adhesive layers by applying a stress of 1,989.44 Pa for about 10 minutes to the adhesive layers under the conditions of a temperature of about 60° C. and a relative humidity of about 93%. The residual strains and recovery rates of the adhesive layers were measured after the elapse of about 10 minutes after the stress was removed. The creep values, residual strains, and recovery rates were each measured three times. The adhesive layers of Comparative Example 3 and Comparative Example 4 did not include the SCA, and the adhesive layers of Experimental Example 3 and Experimental Example 4 included the SCA. The adhesive layers of Comparative Example 3, Comparative Example 4, and Experimental Example 4 had a thickness of about 35 μm. The adhesive layer of Experimental Example 3 had a thickness of about 50 μm.

TABLE 2

| Division | Number of measurements | Comparative Example 3 | Comparative Example 4 | Experimental Example 3 | Experimental Example 4 |
|---|---|---|---|---|---|
| Creep (%) | 1 | 14.37 | 17.41 | 16.29 | 16.98 |
|  | 2 | 13.88 | 14.13 | 16.44 | 17.12 |
|  | 3 | 14.08 | 14.26 | 16.32 | 16.74 |
| Residual strain (%) | 1 | 0.41 | 0.66 | 0.74 | 0.72 |
|  | 2 | 0.42 | 0.43 | 0.68 | 0.82 |
|  | 3 | 0.45 | 0.44 | 0.66 | 0.77 |
| Recovery rate (%) | 1 | 97.12 | 96.23 | 95.43 | 95.73 |
|  | 2 | 96.94 | 96.95 | 95.87 | 95.23 |
|  | 3 | 96.82 | 96.92 | 95.93 | 95.43 |

Referring to Table 2, it may be seen that the adhesive layers of Experimental Example 3 and Experimental Example 4 have creep values similar to those of the adhesive layers of Comparative Example 3 and Comparative Example 4. It may be seen that the adhesive layers of Experimental Example 3 and Experimental Example 4 exhibit good residual strains and recovery rates when compared with the adhesive layers of Comparative Example 3 and Comparative Example 4. It may be seen that the adhesive layers of Experimental Example 3 and Experimental Example 4 have creep values of about 16% to about 18% under the conditions of a temperature of about 60° C. and a relative humidity of about 93%. It may be seen that the adhesive layers of Experimental Example 3 and Experimental Example 4 have residual strains of about 0.6% to about 0.9%, and recovery rates of about 95% to about 96% under the conditions of a temperature of about 60° C. and a relative humidity of about 93%. It may be seen that the adhesive layers of Experimental Example 3 and Experimental Example 4 including a SCA have good creep values, residual strains, and recovery rates. Accordingly, the display device including the adhesive layer in an embodiment may maintain the reliability thereof.

The following Table 3 shows the creep values of the adhesive layers measured by applying a stress of 10,535.06 Pa for about 10 minutes to the adhesive layers. Subsequently, the residual strains and recovery rates of the adhesive layers were measured after the elapse of about 10 minutes. The stress of 10,535.06 Pa was a value representing the LVR behavior of the adhesive layer. In addition, the stress of 10,535.06 Pa was a value considering the stress accumulated in the display device during repeated folding. The creep values, residual strains, and recovery rates of the adhesive layers of Comparative Example 3, Comparative Example 4, and Experimental Example 3 were each measured three times, and the creep value, residual strain, and recovery rate of the adhesive layer of Experimental Example 4 was measured twice.

TABLE 3

| Division | Number of measurements | Comparative Example 3 | Comparative Example 4 | Experimental Example 3 | Experimental Example 4 |
|---|---|---|---|---|---|
| Creep (%) | 1 | 98.82 | 95.60 | 95.88 | 100.60 |
|  | 2 | 102.94 | 99.21 | 94.04 | 98.72 |
|  | 3 | 104.17 | 100.01 | 94.32 | — |
| Residual strain (%) | 1 | 3.52 | 3.90 | 4.37 | 4.48 |
|  | 2 | 3.66 | 4.30 | 4.10 | 4.72 |
|  | 3 | 4.77 | 4.12 | 3.87 | — |
| Recovery rate (%) | 1 | 96.44 | 95.93 | 95.44 | 95.54 |
|  | 2 | 96.44 | 95.66 | 95.64 | 95.22 |
|  | 3 | 95.42 | 95.88 | 95.89 | — |

Referring to Table 3, it may be seen that the adhesive layers of Comparative Example 3, Comparative Example 4, Experimental Example 3, and Experimental Example 4 have residual strains and recovery rates similar to each other.

It may be seen that the adhesive layers of Experimental Example 3 and Experimental Example 4 have a residual strain of about 3% to about 4%, and a recovery rate of about 95% to about 96%.

It may be seen that the adhesive layers of Experimental Example 3 and Experimental Example 4 have creep values similar to those of the adhesive layers of Comparative Example 3 and Comparative Example 4. It may be seen that the adhesive layers of Experimental Example 3 and Experimental Example 4 including the SCA have creep values of about 94% to about 101%. It may be determined that the adhesive layers of Experimental Example 3 and Experimental Example 4 include the SCA, and thus have good creep values, residual strains, and recovery rates. Accordingly, the adhesive layer including the SCA in an embodiment may maintain reliability even after repeated folding and unfolding under the conditions of a temperature of about 60° C. and a relative humidity of about 93%. In addition, the display device including the adhesive layer in an embodiment may exhibit good durability under the conditions of high temperature and high humidity even after repeated folding and unfolding.

In the display devices DD and DD-a in an embodiment, any one of the polarization layer POL (FIG. 3) or the shock absorbing layer SCL (FIG. 4) may be in contact with the adhesive layer AL1. The following Table 4 shows the Young's modulus of the polarization layer, and Table 5 shows the Young's modulus of the shock absorbing layer. The polarization layer and the shock absorbing layer were prepared in accordance with ISO527-3 standards, and the Young's moduli were measured by a UTM (e.g., UTM 565, Instron®). The Young's moduli were measured under the different conditions of temperature and/or humidity, and the Young's moduli were each measured twice under the same conditions. Humidity is the relative humidity, and a room temperature is about 23° C. to about 28° C.

TABLE 4

| Temperature and/or humidity | Number of measurements | Young's modulus (MPa) |
| --- | --- | --- |
| Temperature of −20° C. | 1 | 9,796 |
|  | 2 | 9,674 |
| Room temperature, relative humidity of 40% to 50% | 1 | 8,375 |
|  | 2 | 8,354 |
| Temperature of 60° C. | 1 | 7,046 |
|  | 2 | 6,951 |
| Temperature of 60° C., relative humidity of 93% | 1 | 3,200 |
|  | 2 | 3,320 |

Referring to Table 4, it may be seen that the polarization layer has a Young's modulus of about 9,600 MPa to about 9,800 MPa at a temperature of about −20° C., and a Young's modulus of about 6,900 MPa to about 7,100 MPa at a temperature of about 60° C. In addition, it may be seen that the polarization layer has a Young's modulus of about 8,300 MPa to about 8,500 MPa under the conditions of a room temperature and a relative humidity of about 40% to about 50%, and has a Young's modulus of about 3,200 MPa to about 3,400 MPa under the conditions of a temperature of about 60° C. and a relative humidity of about 93%. In each temperature and/or humidity conditions, it is considered that the polarization layer satisfying the Young's modulus in the aforementioned range would exhibit good adhesion to the adjacent adhesive layer. Accordingly, when a polarization layer that satisfies the Young's modulus in the aforementioned range is disposed adjacent to the adhesive layer, the adhesive layer may exhibit good adhesion characteristics to the polarization layer.

The following Table 5 shows the Young's moduli of the shock absorbing layer, which were measured in the machine direction of the shock absorbing layer and the transverse direction of the shock absorbing layer. In Table 5, "MD" denotes the machine direction, "TD" denotes the transverse direction, the machine direction and the transverse direction represent the stretching direction of the shock absorbing layer, and the machine direction and transverse direction are perpendicular to each other in a plan view.

TABLE 5

| Temperature and/or humidity | MD or TD | Number of measurements | Young's modulus (MPa) |
| --- | --- | --- | --- |
| Temperature −20° C. | MD | 1 | 5,838 |
|  | TD | 1 | 5,740 |
|  | MD | 2 | 6,439 |
|  | TD | 2 | 6,519 |
| Room temperature, relative humidity 40% to 50% | MD | 1 | 5,177 |
|  | TD | 1 | 5,166 |
|  | MD | 2 | 5,764 |
|  | TD | 2 | 5,805 |
| Temperature 60° C. | MD | 1 | 4,352 |
|  | TD | 1 | 4,390 |
|  | MD | 2 | 5,053 |
|  | TD | 2 | 4,925 |
| Temperature 60° C., relative humidity 93% | MD | 1 | 3,990 |
|  | TD | 1 | 3,925 |
|  | MD | 2 | 4,617 |
|  | TD | 2 | 4,577 |

Referring to Table 5, it may be seen that the shock absorbing layer has a Young's modulus of about 5,500 MPa to about 6,600 MPa at a temperature of about 20° C., and has a Young's modulus of about 4,300 MPa to about 5,100 MPa at a temperature of about 60° C. In addition, it may be seen that the shock absorbing layer has a Young's modulus of about 5,000 MPa to about 5,900 MPa under the conditions of a room temperature and a relative humidity of about 40% to about 50%, and about 3,900 MPa to about 4,700 MPa or less under a temperature of about 60° C. and relative humidity of about 93%. In each temperature and/or humidity condition, it may be considered that the shock absorbing layer satisfying the Young's modulus in the abovementioned range would exhibit good adhesion to the adjacent adhesive layer. Accordingly, when the shock absorbing layer satisfying the Young's modulus in the abovementioned range is disposed adjacent to the adhesive layer, the adhesive layer may exhibit good adhesion characteristics to the shock absorbing layer.

The display device in an embodiment may include a polarization layer, an adhesive layer, and a window which are sequentially stacked on a foldable display panel. The adhesive layer includes a SCA, and may exhibit improved adhesion. A 180° peel adhesion of the adhesive layer to the window may be about 493 gf/inch to about 817 gf/inch under the conditions of a temperature of about 60° C. and a relative humidity of about 93%. In addition, a creep value of the adhesive layer may be about 16% to about 18% under the conditions of a temperature of about 60° C. and a relative humidity of about 93%. The creep value of the adhesive layer may be a value when a stress of about 1,900 Pa to about 2,000 Pa is applied. Accordingly, the display device including the adhesive layer in an embodiment may maintain the reliability thereof even after repeated folding and unfolding, and exhibit good durability under the conditions of high temperature and high humidity.

An embodiment may provide a display device which includes an adhesive layer disposed between a polarization layer and a window and thus maintains reliability even after repeated folding and unfolding.

Although the embodiments of the invention have been described, it is understood that the invention should not be limited to these embodiments but various changes and modifications may be made by one ordinary skilled in the art within the spirit and scope of the invention.

What is claimed is:

1. A display device comprising:
   a display panel which is foldable with reference to at least one folding axis;
   a polarization layer disposed on the display panel;
   an adhesive layer disposed on the polarization layer; and
   a window disposed on the adhesive layer, and including one surface facing the adhesive layer,
   wherein a 180 degree peel adhesion of the adhesive layer to the one surface of the window is about 493 gram-force per inch to about 817 gram-force per inch under conditions of a temperature of about 60 degrees Celsius and a relative humidity of about 93 percent.

2. The display device of claim 1, wherein the adhesive layer comprises an acrylic resin and a silane coupling agent.

3. The display device of claim 1, wherein the one surface of the window is one surface of a glass substrate, and
the 180 degree peel adhesion of the adhesive layer to the one surface is about 493 gram-force per inch to about 556 gram-force per inch.

4. The display device of claim 1, wherein the one surface of the window is one surface of a plasma-treated glass substrate, and
the 180 degree peel adhesion of the adhesive layer to the one surface is about 636 gram-force per inch to 817 gram-force per inch.

5. The display device of claim 1, wherein, when a stress of about 1,900 pascals to about 2,000 pascals is applied for about 10 minutes to the adhesive layer under the conditions of the temperature of about 60 degrees Celsius and the relative humidity of about 93 percent, a creep value of the adhesive layer is about 16 percent to about 18 percent.

6. The display device of claim 1, wherein, when a stress of about 1,900 pascals to about 2,000 pascals is applied for about 10 minutes to the adhesive layer under the conditions of a temperature of about 60 degrees Celsius and a relative humidity of about 93 percent, a residual strain of the adhesive layer after an elapse of additional about 10 minutes is about 0.6 percent to about 0.9 percent, and a recovery rate of the adhesive layer is about 95 percent to about 96 percent.

7. The display device of claim 1, wherein, when a stress of about 9,900 pascals to about 12,210 pascals is applied for about 10 minutes to the adhesive layer under the conditions of the temperature of about 60 degrees Celsius and the relative humidity of about 93 percent, a creep value of the adhesive layer is about 94 percent to about 101 percent.

8. The display device of claim 1, wherein, when a stress of about 9,900 pascals to about 12,210 pascals is applied for about 10 minutes to the adhesive layer under the conditions of the temperature of about 60 degrees Celsius and the relative humidity of about 93 percent, a residual strain of the adhesive layer after an elapse of additional about 10 minutes is about 3 percent to about 4 percent, and a recovery rate of the adhesive layer is about 95 percent to about 96 percent.

9. The display device of claim 1, wherein a thickness of the adhesive layer is about 10 micrometers to about 70 micrometers.

10. The display device of claim 1, wherein the adhesive layer comprises a polymer resin having a glass transition temperature of about −40 degrees Celsius or less.

11. The display device of claim 1, wherein the polarization layer has a Young's modulus of about 9,600 megapascals to about 9,800 megapascals at a temperature of about −20 degrees Celsius, and
a Young's modulus of about 6,900 megapascals to about 7,100 megapascals at the temperature of about 60 degrees Celsius.

12. The display device of claim 1, wherein the polarization layer has a Young's modulus of about 8,300 megapascals to about 8,500 megapascals under conditions of a room temperature and a relative humidity of about 40 percent to about 50 percent, and
a Young's modulus of about 3,200 megapascals to about 3,400 megapascals under the conditions of a temperature of about 60 degrees Celsius and a relative humidity of about 93 percent.

13. The display device of claim 1, wherein the display device is in-foldable with reference to the at least one folding axis.

14. The display device of claim 1, further comprising a shock absorbing layer disposed between the adhesive layer and the polarization layer, wherein the shock absorbing layer has
a Young's modulus of about 5,500 megapascals to about 6,600 megapascals at a temperature of about −20 degrees Celsius, and
a Young's modulus of about 4,300 megapascals to about 5,100 megapascals at the temperature of about 60 degrees Celsius.

15. The display device of claim 14, wherein the shock absorbing layer has
a Young's modulus of about 5,000 megapascals to about 5,900 megapascals under conditions of a room temperature and a relative humidity of about 40 percent to about 50 percent, and
a Young's modulus of about 3,900 megapascals to about 4,700 megapascals under the conditions of the temperature of about 60 degrees Celsius and the relative humidity of about 93 percent.

16. The display device of claim 1, further comprising:
at least one functional layer disposed under the display panel; and
an auxiliary adhesive layer disposed under the at least one functional layer, and
wherein the 180 degree peel adhesion of the auxiliary adhesive layer to the at least one functional layer is about 493 gram-force per inch to about 817 gram-force per inch under the conditions of the temperature of about 60 degrees Celsius and the relative humidity of about 93 percent.

17. A display device comprising:
a display panel which is foldable with reference to at least one folding axis;
a polarization layer disposed on the display panel;
an adhesive layer disposed on the polarization layer; and
a window disposed on the adhesive layer, and including one surface facing the adhesive layer, wherein,
when a stress of about 1,900 pascals to about 2,000 pascals is applied for about 10 minutes to the adhesive layer under conditions of a temperature of about 60 degrees Celsius and a relative humidity of about 93 percent, the adhesive layer has a creep value of about 16 percent to about 18 percent, and,
when a stress of about 9,900 pascals to about 12,210 pascals is applied for about 10 minutes to the adhesive layer under the conditions of the temperature of about 60 degrees Celsius and the relative humidity of about 93 percent, the adhesive layer has a creep value of about 94 percent to about 101 percent.

18. The display device of claim 17, wherein a 180 degree peel adhesion of the adhesive layer to the one surface of the window is about 493 gram-force per inch to about 817 gram-force per inch under the conditions of the temperature of 60 degrees Celsius and the relative humidity of about 93 percent.

19. The display device of claim 17, wherein the adhesive layer comprises at least one among trimethoxy(3-(oxiranyl-2-methoxy)propyl) silane, 3-glycidoxy propyl trimethoxy silane, 3-glycidoxy propyl triethoxy silane, 3-(2,3-epoxy-propoxypropyl)methyldimethoxysilane, 3-(2,3-epoxypropoxypropyl)methyldiethoxysilane, 2-(3,4-epoxycyclohexyl) ethylmethyldimethoxysilane, and 2-(3,4-epoxycyclohexyl) ethyltrimethoxysilane.

20. The display device of claim 17, wherein the window comprises a glass substrate, and the window further comprises a protective layer disposed on the glass substrate.

\* \* \* \* \*